US011568232B2

(12) United States Patent
Huang et al.

(10) Patent No.: US 11,568,232 B2
(45) Date of Patent: Jan. 31, 2023

(54) DEEP LEARNING FPGA CONVERTER

(71) Applicant: QUANTA COMPUTER INC., Taoyuan (TW)

(72) Inventors: Kuan-Chieh Huang, Taoyuan (TW); Yi-Ting Peng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 1395 days.

(21) Appl. No.: 15/891,762

(22) Filed: Feb. 8, 2018

(65) Prior Publication Data

US 2019/0244095 A1 Aug. 8, 2019

(51) Int. Cl.
*G06F 9/44* (2018.01)
*G06N 3/08* (2006.01)
*G06N 3/04* (2006.01)
*G06N 3/10* (2006.01)
*G06F 30/34* (2020.01)
*G06F 9/50* (2006.01)
*H03K 19/177* (2020.01)

(52) U.S. Cl.
CPC ............. *G06N 3/08* (2013.01); *G06F 9/5011* (2013.01); *G06F 9/5061* (2013.01); *G06F 30/34* (2020.01); *G06N 3/04* (2013.01); *G06N 3/082* (2013.01); *G06N 3/105* (2013.01); *H03K 19/177* (2013.01)

(58) Field of Classification Search
CPC ....................................................... G06N 3/08

USPC ........................................................ 716/116
See application file for complete search history.

(56) References Cited

U.S. PATENT DOCUMENTS

| 2010/0076915 | A1 | 3/2010 | Xu et al. | |
| 2018/0158181 | A1* | 6/2018 | Kulkarni | G06N 3/0472 |
| 2019/0057305 | A1* | 2/2019 | Denolf | G06N 3/063 |

FOREIGN PATENT DOCUMENTS

| CN | 106228240 A | 12/2016 |
| CN | 106529668 A | 3/2017 |
| CN | 104680236 B | 8/2017 |
| CN | 107239829 A | 10/2017 |

OTHER PUBLICATIONS

TW Office Action for Application No. 107123892, dated Aug. 26, 2019, w/ First Office Action Summary.
TW Search Report for Application No. 107123892, dated Aug. 26, 2019, w/ First Office Action.
Extended European Search Report for EP Application No. 18205023.7, dated Jun. 14, 2019.

(Continued)

*Primary Examiner* — Timothy A Mudrick
(74) *Attorney, Agent, or Firm* — Nixon Peabody LLP (57) ABSTRACT

Systems and methods for programming field programmable gate array (FPGA) devices are provided. A trained model for a deep learning process is obtained and converted to design abstraction (DA) code defining logic block circuits for programming an FPGA device. Each of these logic block circuits represents one of a plurality of modules that executes a processing step between different layers of the deep learning process.

12 Claims, 8 Drawing Sheets

(56) References Cited

OTHER PUBLICATIONS

Ma Yufei, et al.: An Automatic RTL Compiler for High-Throughput FPGA Implementation of Diverse Deep Convolutional Neural Networks, Sep. 4, 2017 (Sep. 4, 2017), pp. 1-8, XP033160700, DOI: 10.23919/FPL.2017.8056824, 2017 27th International Conference on Field Programmable Logic and Applications (FPL), Ghent University, Ghent, Belgium.

Kaiyuan Guo, et al.: [DL] A Survey of FPGA Based Neural Network Accelerator; ACM Transactions of Reconfigurable Technology and Systems, Dec. 24, 2017 (Dec. 24, 2017), 21 pages, vol. 9, No. 4, Article 11, XP080848355, Arxiv.org, Cornell University Library, 201 Olin Library Cornell University Ithaca, NY, USA.

Hegde Gopalakrishna, et al.: CaffePresso: An Optimized Library for Deep Learning on Embedded Accelerator-based platforms, Oct. 2, 2016 (Oct. 2, 2016), pp. 1-10, XP033005306, DOI: 10.1145/2968455.2968511. 2016 International Conference on Compliers, Architectures, and Sythesis of Embedded Systems (Cases), ACM.

Hamdan Muhammad K. et al.: VHDL Generator for a High Performance Convolutional Neural Network FPGA-Based Accelerator, Dec. 4, 2017 (Dec. 4, 2017), pp. 1-6, XP033313056, DOI: 10.1109/RECONFIG.2017.8279827, 2017 International Conference on Reconfigurable Computing and FPGAS (Reconfig), IEEE.

\* cited by examiner

DEEP LEARNING FPGA CONVERTER

FIELD OF THE INVENTION

The present invention relates to field programmable gate array (FPGA) devices, and more specifically to apparatus and methods for programming FPGA devices for deep learning, artificial neural networks, and machine learning applications.

BACKGROUND

Implementation of deep learning applications typically require a hierarchical software stack that is relatively complex to use and manage. Deep learning applications include, but are not limited to, autonomous vehicle application, object detection and identification, and computer-aided diagnosis system. As a result, users developing deep learning applications based on a trained model are also required to install and call many related software components—e.g., frameworks, libraries, and interfaces—to support multiple applications. Moreover, if there is any need to make changes in the trained model or any portion of the stack, it is typically necessary to rebuild all the related dependencies. Additionally, as the software stack associated with deep learning applications becomes more complex, the additional overhead can substantially affect the performance of such applications.

From a development point of view, a complex software stack places additional burdens on the developer. For example, the developer is now required to be familiar with different software stack compositions for different scenarios. As a result, developing a stack that addresses different scenarios is time-consuming and difficult. From a performance point of view, the complex software may not just be suboptimal for all scenarios due to the extra overheard, but additional overhead may accrue as the software stack is required to be deeper for certain applications, i.e., include a larger number of layers and support more features in each of the layers.

To optimize the implementation of deep learning applications, one conventional solution is to use an application-specific integrated circuit (ASIC). Normally, ASICs are optimized to perform specific tasks and therefore improve the performance of such tasks. However, as noted above, the stack requirements for deep learning models can vary significantly. Thus, ASICs are typically too specific and thus limited in applicability. As a result, they may still not ADDRESS THE NEEDS for a wide variety of applications.

Another conventional approach to optimize the implementation of deep learning applications is to use FPGA devices. FPGA devices are attractive to developers because they are reprogrammable and are therefore flexible for adapting to various trained models and applications. However, FPGA device programming for deep learning applications is not straightforward. As a result, development solutions for handling deep learning applications are typically limited. One solution is to provide a deep learning software development kit based on known software stacks. However, this results in substantially the same stack management and overhead issues discussed above. Another solution is to use "turn-key" solutions—in which a toolkit is provided to allow users to support certain deep learning applications. However, this limited support for applications results in the same issues seen with ASICs.

In view of the foregoing, there is a need for systems and methods to simplify FPGA device programming for deep learning applications that more fully leverages the advantages of FPGA devices.

SUMMARY

Embodiments of the invention concern systems, methods, and computer programs for programming FPGA devices. An exemplary method involves obtaining a trained model for a deep learning process and converting the trained model to design abstraction (DA) code. Thereafter, an FPGA device in a system can be programmed based on the DA code. The DA code is configured to define a plurality of logic block circuits, where each of the plurality of logic block circuits represents one of a plurality of modules. Each of these modules represents a processing step between different layers of the deep learning process. In some implementations, the design abstraction code is register-transfer level (RTL) code for programming FPGA devices.

In some implementations, the step of converting can include specifying the flow of data through the plurality of logic block circuits. In turn, the DA code specifies an interconnection of the plurality of logic block circuits in the FPGA device to provide this flow of data.

The converting can also include identifying processing steps in the trained model and associating each of the plurality of processing steps with one of the plurality of modules. Thereafter, logic block circuits can be encoded that correspond to the modules associated with the processing steps.

In some implementations, the method can involve additional steps prior to programming. For example, a determination can be made that the capacity of FPGA device is insufficient for supporting the plurality of logic block circuits required by the DA code. If such a determination is made, then an alternate programming mode can be used for the FPGA device during the programming step.

One alternate programming mode involves identifying DA code corresponding to logic blocks circuits performing duplicates of an operation to yield duplicate logic block circuits. Then, all but one of these duplicate blocks can be deleted. The DA code can then be updated to configure the FPGA device to perform the duplicates of the operation using the remaining one of the duplicate logic block circuits.

Another alternative programming mode involves identifying DA code corresponding to logic block circuits representing modules performing an operation performed by another component in the system to again yield duplicate logic block circuits. Then, all the duplicate logic block circuits can be deleted from the DA code. The DA code can also be updated to configure the FPGA to perform the duplicates of the operation using the other component.

Other embodiments involve a system with a processor, an FPGA device, and a memory for causing the processor to implement the methodology described above. Still other embodiments involve a non-transitory computer-readable medium for causing a computing device to implement the method described above.

DETAILED DESCRIPTION

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted above, conventional solutions for implementing deep learning applications using FPGA devices are generally limited and complicated. In view of such limitations, the various embodiments are directed to a new methodology for implementing trained models directly into FPGA devices, and thus eliminate the complexity and overhead problems typically encountered with conventional FPGA device programming solutions for deep learning. In particular, the various embodiments are directed to systems and methods for implementing a novel FPGA converter for deep learning applications. The systems and methods discussed there are configured to convert a trained model into register-transfer level (RTL) code or other DA code. Other DA code can include, but is not limited to Verilog or OpenCL code. The DA code can then be used to configure an FPGA device directly. By using such a configuration, the novel FPGA converter of the various embodiments can not only reduce the complex development procedures, thus improving the developer experience, but can also provide a more compact model that is tuned for the target FPGA device to be used.

Figure 1:
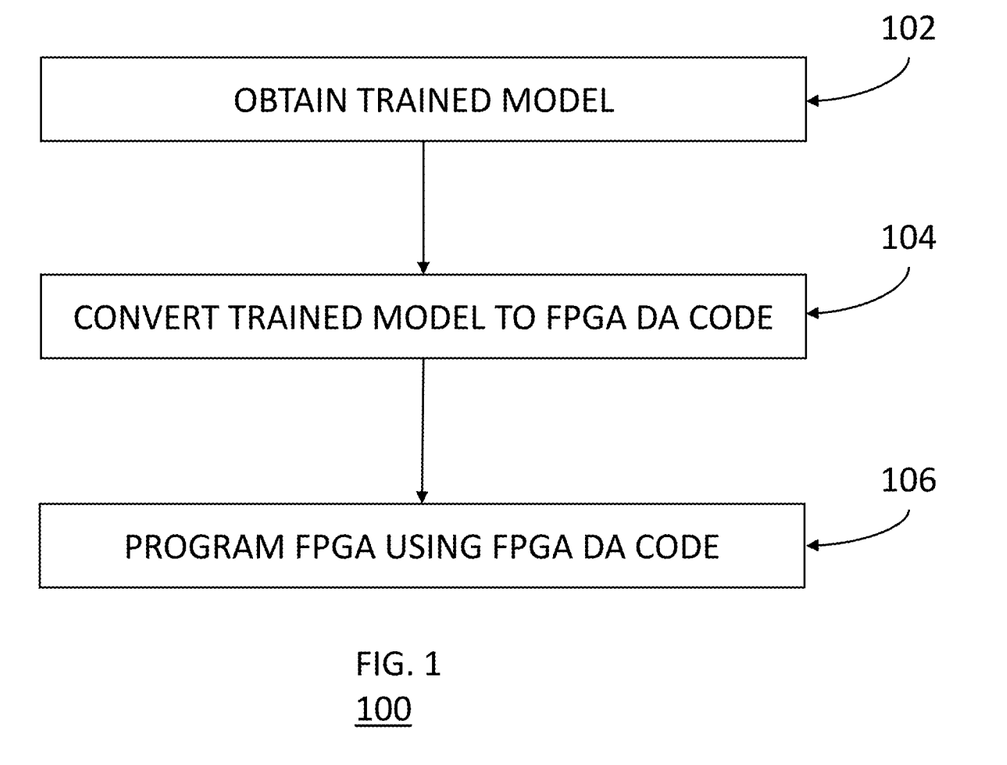
FIG. 1 is a flowchart of steps in an exemplary method according to an embodiment.

The overall methodology of the various embodiments is illustrated in FIG. 1. FIG. 1 is a flowchart of steps in an exemplary method 100 for transferring a trained model to an FPGA device. The method can begin at step 102, where a trained model for the FPGA device is obtained. The trained model can be any type of machine learning model, including but not limited to decision tree based models, linear regression based models, neural network based models, Bayesian network based models, support vector machine based models, and nearest neighbor based models, to name a few. The machine learning model provided can also be a combination of different types of models. Moreover, the model can be provided in any type of format. For example, a neural network model can be provided using such typical models as AlexNet, GoogleNet, ResNet, DenseNet, or using another other type of neural network format. However, in the various embodiments, the type and format of model is not limited to those described above. Although the model can be preprocessed and trained in some embodiments, in other embodiments no preprocessing is needed since a trained model typically includes all files needed for using the model. For example, such files can include files providing the customized architecture with parameters such as the number of layers, the type of each layer, the number of kernels, kernel size, and files providing parameter such as training weights.

After the trained model is obtained at step 102, the model can be converted to DA code at step 104. Step 104 involves providing the model obtained at step 102 to an FPGA converter system for processing. This FPGA device convertor system can be part of the system in which the deep learning application is to be executed, or a separate system altogether. Further, the FPGA converter system can be implemented as software components, hardware components, or a combination of software and hardware components.

Finally, at step 106, the DA code obtained at step 104 can be used to program an FPGA device at step 106. Such programming can be performed using any know FPGA device programming techniques. Further, such programming can be performed in the system in which the deep learning application is to be executed, or a separate system altogether. However, the latter configuration provides the advantage that the FPGA device can be reprogrammed on demand to support different applications.

Figure 2:
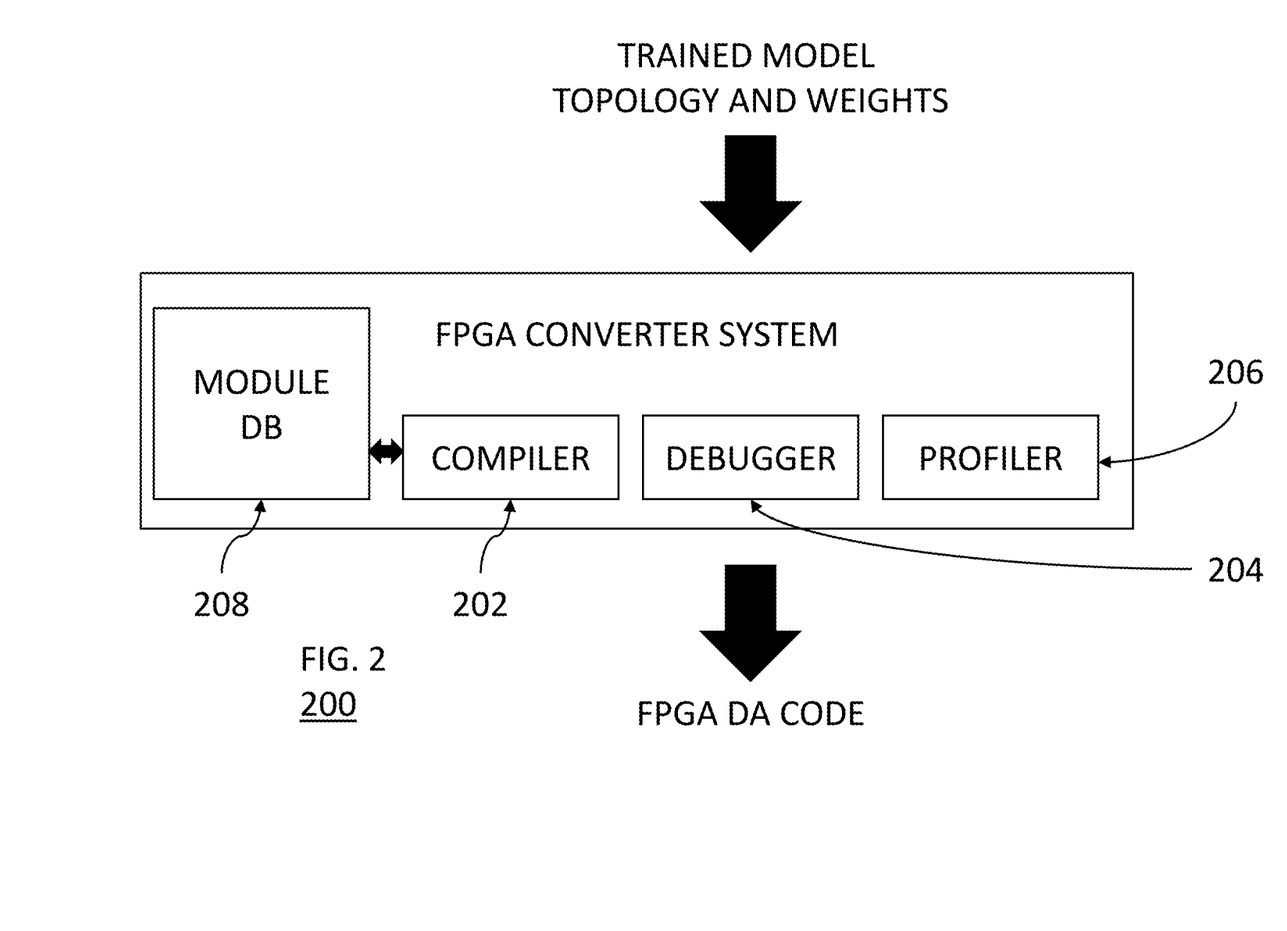
FIG. 2 schematically illustrates a FPGA converter system according to an embodiment.

One exemplary implementation of an FPGA device convertor system according to the various embodiments is illustrated in FIG. 2. As shown in FIG. 2, an FPGA converter system 200 can include various components, such as a complier 202, a debugger 204, and a profiler 206. The compiler 202 can be configured to compile (i.e., convert) trained models into DA code. The debugger 204 can be provided so the developer can see and review error messages as generated by the operation of the compiler 202, and thereafter perform any necessary debugging or updating of the FPGA device DA. The profiler 206 can be provided to the developer as a diagnostic tool for analyzing the compile-time and run-time behaviors of the model being converted.

In operation, the compiler 202 is configured to select modules from a module database 208 of FPGA converter system 200, where each module is associated with a processing step between particular layers of deep learning processes. Each of these modules can be configured so as to optimize efficiency of the processing step within the target FPGA device. In some implementations, the modules can be optimized for the type of model being used. Selection of modules is performed is as follows. When the model is provided to the FPGA converter system 200, the complier 202 will first perform an analysis on the composition of the model to break down the module into a series of processes.

Next, the complier 202 identifies a series of modules from the database 208 corresponding to the series of processes. Finally, the appropriate parameters are associated with each of the modules so as to be able to implement the corresponding process of the trained model.

In the various implementations, the modules can include, but are not limited to, convolution modules for applying convolution filters to images (C), ReLU modules for applying an activation function to the output of convolution modules (R), normalization modules scaling image data to a different range (N), pooling modules for down-sampling image data extracted by convolution modules (P), fully connected modules for performing classification on features extracted by convolution modules and down-sampled by pooling modules (F), dropout modules for selecting nodes to be dropped turning training (D), and softmax modules for generating an output probability distribution based on a input range of values. (S). However, the various embodiments are not limited in this regard and FPGA converter systems in accordance with the various embodiments can be configured to support more or less module types than described above.

As can be seen from the above, the different modules execute different operations. Some modules can be optimized with software (algorithms) or meet the limitation of hardware resources. For example, a convolution operation can be factorized into many vector operations, each of which can operate independently. Accordingly, one can unroll the operation and execute the various operations in parallel, i.e., at the same time. In another example, reducing the precision is also a good way for efficiency to improve performance. In addition, weight pruning, compression by clustering, and matrix factorization are significant algorithm-level approaches to compact the trained model and speed up inference. In some embodiments, a hardware optimization can be used. For example, a look-up table can be used to map a result, instead of performing calculations.

Figure 3:
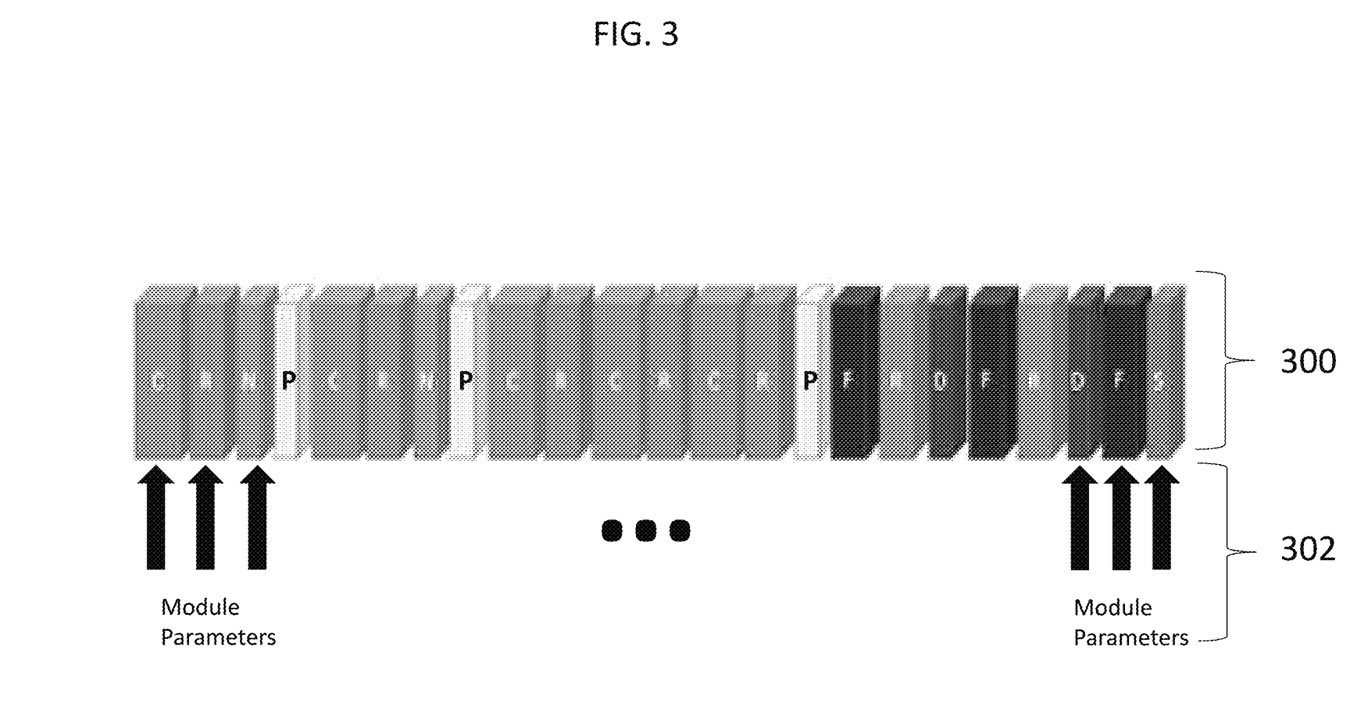
FIG. 3 schematically illustrates a series of modules and parameters, according to an embodiment, and corresponding to a model.

The compilation process thus results in a collection of modules to be executed in series by the FPGA device. For example, one exemplary series of modules 300 is illustrated in FIG. 3. For ease of illustration, the modules in FIG. 3 are limited to those discussed above. However, as noted above, the various embodiments can be configured to support more or less module types than those enumerated above. Further, as shown in FIG. 3, each of the modules in series 300 can be associated with one of a set of parameters 302. However, in some implementations, some or all of the modules in series 300 may not require any parameters.

Figure 4:
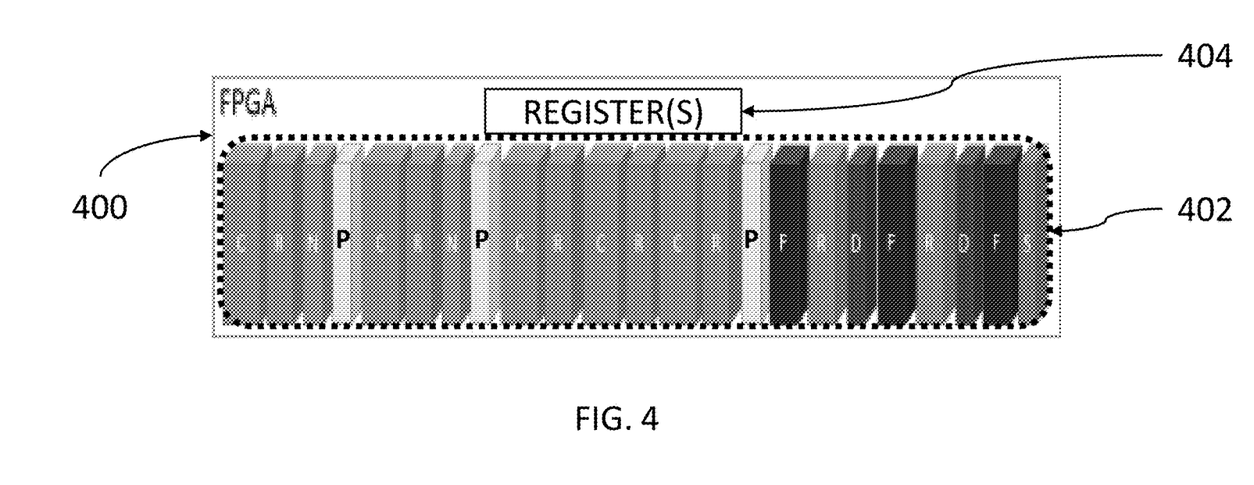
FIG. 4 schematically shows an FPGA device programmed in a "complete" mode according to an embodiment.

As noted above with respect to FIG. 1, once the DA code has been generated, an FPGA device or board can be programmed using the DA code, and can thereafter be used for deep learning workloads or applications. An exemplary programmed FPGA device 400 is illustrated in FIG. 4. As shown in FIG. 4, the FPGA device 400 includes a gate array 402 that has been programmed to define a series of interconnected logic blocks. In particular, as shown in FIG. 4, the logic blocks in the array 402 correspond the series of modules 300 in FIG. 3. The parameters 302 from FIG. 3 can be programmed into one or more registers 404 in FIG. 4 and interconnected with the logic blocks in array 402 as needed.

Figure 5:
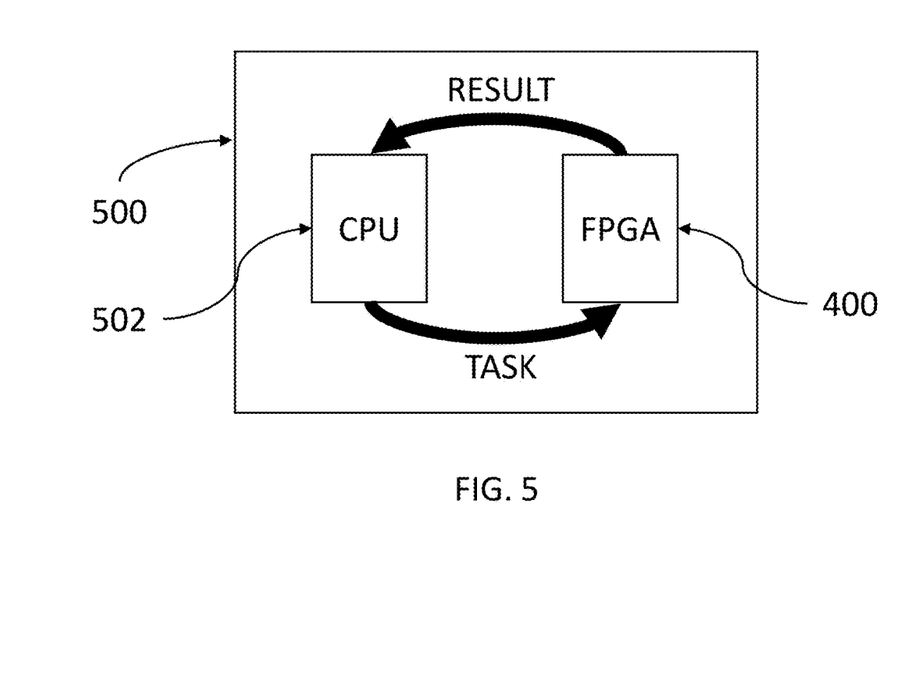
FIG. 5 shows a schematic diagram of a system using the FPGA device of FIG. 4.

The programmed FPGA device 400 can then be used as shown in FIG. 5. FIG. 5 schematically shows data flow in a system 500 performing deep learning workloads. As shown in FIG. 5, the system includes a central processing unit (CPU) 502 and FPGA device 400. In operation, when the CPU 502 encounters a deep learning task, the task is forwarded to FPGA device 400. FPGA device 400 then executes the task according to the model programmed therein. Thereafter, FPGA device 400 provides the result back to CPU 502.

In some implementations, the parameters need not be stored in the FPGA device being programmed. Rather, such parameters can be passed to the FPGA device when a deep learning task needs to be performed. Alternatively, a separate memory device can be coupled to the FPGA device to store the parameters for the FPGA device.

The configuration of FPGA device 400 and the process illustrated in FIG. 5 are both based on the assumption that an FPGA device only operates in a "complete" mode. That is, that a model can be completely implemented within the FPGA device. However, in certain circumstances such a configuration is not possible due to hardware constraints or limitations of the FPGA device. For example, a gate array of the FPGA device may not have a sufficient number of gates to define each and every instance of the modules needed for implementing the model in the FPGA device. In some cases, it may be possible to chain several FPGA device's together in series to perform the task. In such a configuration, each FPGA device would contain a portion of the series with the last FPGA device feeding the final result back to the CPU. However, in other instances, there may simply be insufficient physical space in the system for multiple FPGA devices. As such, alternative programming modes can be provided in the various embodiments to overcome such obstacles.

In some embodiments, the FPGA device can be programmed to operate, if possible, in an "economic" mode. That is, if the series of modules needed for the implementing the model includes duplicate operations, then the modules associated with the duplicate operations can be reused within the FPGA device. An FPGA device 600 configured in this manner is schematically illustrated in FIG. 6.

Figure 6:
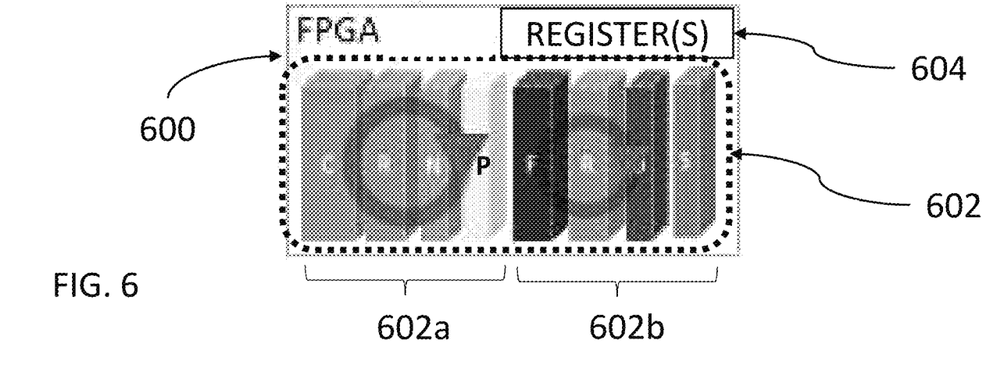
FIG. 6 schematically shows an FPGA device programmed in an "economical" mode according to an embodiment.

As shown in FIG. 6, the FPGA device 600 includes a gate array 602 that has been programmed to define a series of interconnected logic blocks. In particular, as shown in FIG. 6, the logic blocks in the array 602 include a first group 602a and a second group 602b. Each of the groups 602a and 602b correspond to duplicate operations within a model. Parameters can be programmed into one or more registers 604 and interconnected with the logic blocks in the array 602 as needed. In FPGA device 600, the groups 602a and 602b can be configured so as to perform their respective operations as many a number of times as needed for each (as indicated by loops in FIG. 6).

Figure 7:
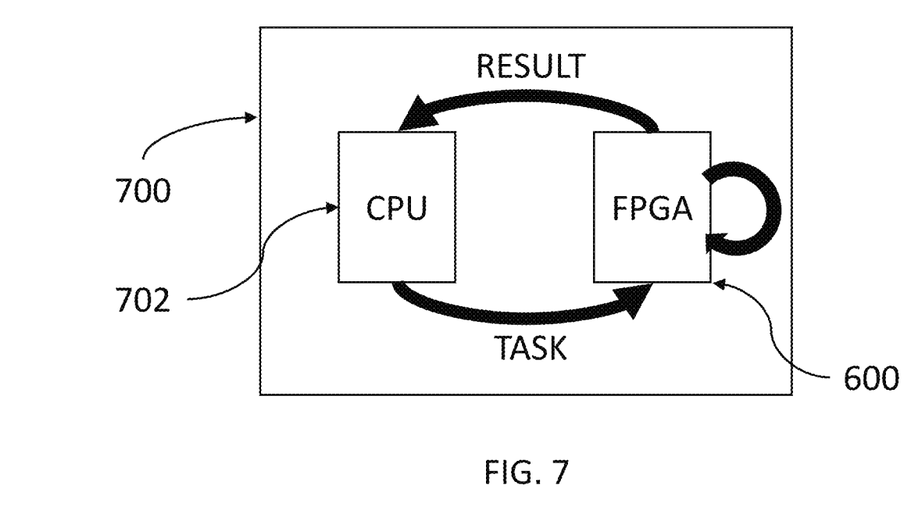
FIG. 7 shows a schematic diagram of a system using the FPGA device of FIG. 6.

The programmed FPGA device 600 can then be used as shown in FIG. 7. FIG. 7 schematically shows data flow in a system 700 performing deep learning workloads. As shown in FIG. 7, the system includes a central processing unit (CPU) 702 and FPGA device 600. In operation, when the CPU 702 encounters a deep learning task, the task is forwarded to FPGA device 600. FPGA device 600 then executes the task according to the model programmed therein, repeating tasks as needed (as indicated by loop). Thereafter, FPGA device 600 provides the result back to CPU 702.

It is contemplated that in some embodiments, the repetition of operations in an FPGA device can be managed in a variety of ways. For example, in some embodiments, an FPGA device can have a hardwired dataflow to ensure that data flows back to the appropriate modules in the FPGA device to ensure that the correct number of duplicate operations is performed. In other embodiments, part of the gate array of the FPGA device can be configured to define a logic for controlling and managing the data flow. In still other embodiments, the process can be controlled by the CPU. That is, the results of a first pass can be provided to the CPU, and the CPU can pass the results back to the FPGA device for further processing until the number of duplicate operations is performed. Additionally, a combination of the above-mentioned techniques can be used in the various embodiments.

In some embodiments, an FPGA device can be configured to skip or bypass modules. For example, FIG. 6 illustrates that FPGA device 600 is configured for using module sequence "CRNP" one or more times, followed by using module sequence "FRDS" one or more times. This same result can be achieved in FPGA device 400 of FIG. 4 with bypassing. That is, as shown in FIG. 4, the sequence "CRNP" is used twice. Thereafter, to achieve the "FRDS" sequence, the FPGA device 400 can be configured to skip forward to the next instances of "F", "R", "D", and "S". In such configurations, the FPGA device 400 can be configured to receive additional parameters for controlling how and which modules are bypassed. In some embodiments, repeat and bypass functionality can be implemented together on a same FPGA device. Thus, referring back to FIG. 4, if more than two instances of "CRNP" are needed, the FPGA device 400 can be configured to repeat one of more the available instances to provide the functions needed.

As discussed above, in some embodiments, a model can be stored in a series of FPGA devices that process the input from the CPU in series, and the last FPGA device passes the final result back to the CPU. However, in some embodiments, a "hybrid" mode can be provided. That is, the number of modules, and thus the number of logic circuit blocks, required for the FPGA device can be reduced where such modules are already implemented elsewhere in the system. For example, other FPGA devices or accelerators in the system may already be configured to include logic circuit blocks implementing such modules. In this case, the FPGA device can be configured to cooperate with these other devices deep learning tasks. This is schematically illustrated in FIGS. 8 and 9.

Figure 8:
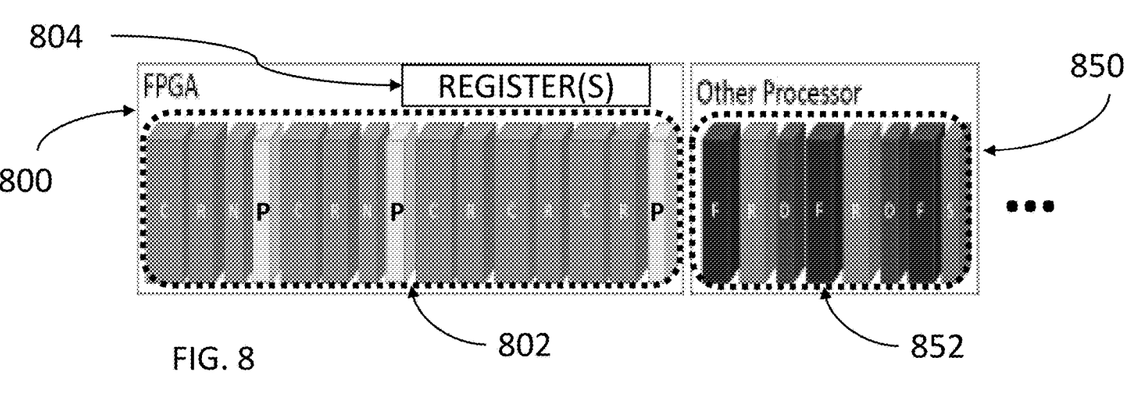
FIG. 8 schematically shows an FPGA device and another processor, where the FPGA device is programmed for a "hybrid" mode according to an embodiment.

FIG. 8 shows an FPGA device 800 programmed to operate cooperatively with another processor 850. FPGA device 800 includes a gate array 802 that has been programmed to define a series of interconnected logic blocks. Parameters can be programmed into one or more registers 804 and interconnected with the logic blocks in the array 802 as needed. The other processor 850 can also be an FPGA device, an accelerator, or some other processor. The other processor 850 can include logic blocks 852 for implementing operations that cannot be performed by the logic blocks in gate array 802. In some implementations, additional FPGA devices, accelerators, or other processors can also be added to perform additional operations not available in either of FPGA device 800 or other processor 850.

Figure 9:
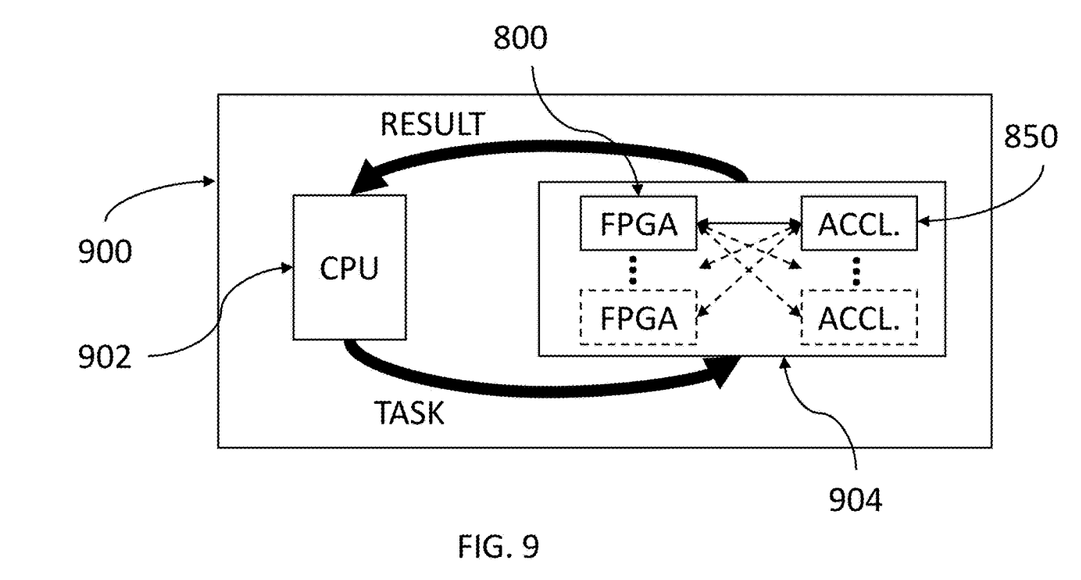
FIG. 9 shows a schematic diagram of a system using the FPGA device and other processor of FIG. 8.

The programmed FPGA device 800 and the other processor 850 (along with any other devices) can then be used as shown in FIG. 9. FIG. 9 schematically shows data flow in a system 900 performing deep learning workloads. As shown in FIG. 9, the system includes a central processing unit (CPU) 902 and hybrid processing system 904. In operation, when the CPU 904 encounters a deep learning task, the task is forwarded to hybrid processing system 904. Once the task is completed, hybrid processing system 904 provides the result back to CPU 902.

In system 900, hybrid processing system 904 consists of at least FPGA device 800 and other processor 850 (in this case configured as an accelerator). However, as noted above with respect to FIG. 8, FPGA device 800 and other processor 850 can be configured to operate with various other devices. Therefore, as shown in FIG. 9, hybrid processing system 904 can include one or more additional devices.

Hybrid processing system 904 operates as follows. After receipt of the task from the CPU 902, the task is passed to one of the components within hybrid processing system 904. That component then performs some of the operations and passes the task to another component within hybrid processing system 904. This process is repeated until the task is completed. The component completing the final operations for the task can then pass the final result back to CPU 902.

For example, FPGA device 800 can perform first operations for the task and then other processor 850 can perform additional operations for the task. The other processor 850 can then pass the task back to the CPU 902 if completed. If not completed (i.e., more operations are needed), the task can be passed back to FPGA device 800 or another component in hybrid processing system 904 as needed for completing of the task.

In certain embodiments, a CPU can also be part of a hybrid processing system. That is, the CPU may contain logic for performing certain operations efficiently. Accordingly, in some cases data can pass between the CPU, the FPGA, and other components to enable completion of all operations.

In the various embodiments, the parameters for the various components of a hybrid processing system can be stored in a variety of ways. In some cases, parameters for each component can be stored with each component. In other cases, such parameters can be passed to the component when an operation needs to be performed. Such parameters can be passed from sources internal or external to the hybrid processing system. For example, parameters can be provided from a CPU. Alternatively, a separate memory device can be coupled to the hybrid processing system to store such parameters.

In some embodiments, the "hybrid" and "economic" modes can be combined. That is, the operations provided by the various components can be repeated as necessary. For example, referring back to FIG. 9, operations performed by FPGA device 800, other processor 850, or any of the other components in hybrid processing system 904 can be configured to be repeated as needed, for completion of the task.

As discussed above, the repetition of operations can be managed in a variety of ways. For example, in some embodiments using a hybrid processing system, the components in the hybrid processing system can a hardwired dataflow between components to ensure that data flows back to the appropriate components and that the correct number of duplicate operations is performed. In other embodiments, one or more of the components of the hybrid processing system can be configured to define logic for controlling and managing the data flow among the component. In still other embodiments, the process can be controlled by the CPU. That is, the results of a first pass can be provided to the CPU and the CPU can pass the results back to the hybrid processing system for further processing until the number of duplicate operations is performed. Additionally, a combination of the above-mentioned techniques can be used in the various embodiments.

In the various embodiments, it is contemplated that the mode selection can be automatically selected. That is, the complier can examine the FPGA device to be utilized and determine which modes are possible and select an appropriate mode without user input. For example, if the complier determines that the FPGA device is unable to hold the entire model (i.e., the "complete" mode is not possible), the complier can determine whether one or both of the "economic" and "hybrid" modes can be implemented. If both modes are possible, the complier can then be configured to examine the FPGA device and/or other components so as to identify which mode is expected to provide the best performance for the operations needed. Alternatively, the complier can select modes in an order of preference.

In some embodiments, the user can specify a desired or a preferred mode. For example, if the "complete" mode is possible, the user can indicate that the complier should be configured to automatically use an FPGA device in this mode. In another example, if the user is aware that certain components are already present in the system for performing certain operations efficiently, the user can request the hybrid mode. In some cases, the user can also identify existing components to be leveraged. However, in other cases, the compiler can be configured to automatically discover components in the system. In this way, the user can choose to leverage the existing capabilities of the system. In still another example, the user can also specify a preference between the "economic" and "hybrid" modes.

An example of mode selection is as follows. The complier will analyze the trained model, the components detected (CPU, FPGA, or GPU), the required resource (memory, registers), and the most efficient way of implementing each module. For example, a convolution operation is typically performed more efficiently using a GPU. Therefore, if the complier detects that a GPU is available in the computing system, a hybrid mode can be selected so that the convolution operations are performed using the GPU's capabilities. In another example, if the complier determines that the FPGA cannot meet the requirements for implementing one or more modules needed for the model, the converter may associate CPU, GPU or other available FPGAs with the FPGA in order to perform these tasks.

Although the exemplary embodiments have been described above with limited details regarding systems they may be implemented in or otherwise used with, this is solely for ease of illustration. Rather, the various embodiments can be implemented in or otherwise used with systems that include more components that described above. One exemplary system is illustrated with respect to FIGS. 10 and 11. However, the various embodiments are not limited to this exemplary system.

Figure 10:
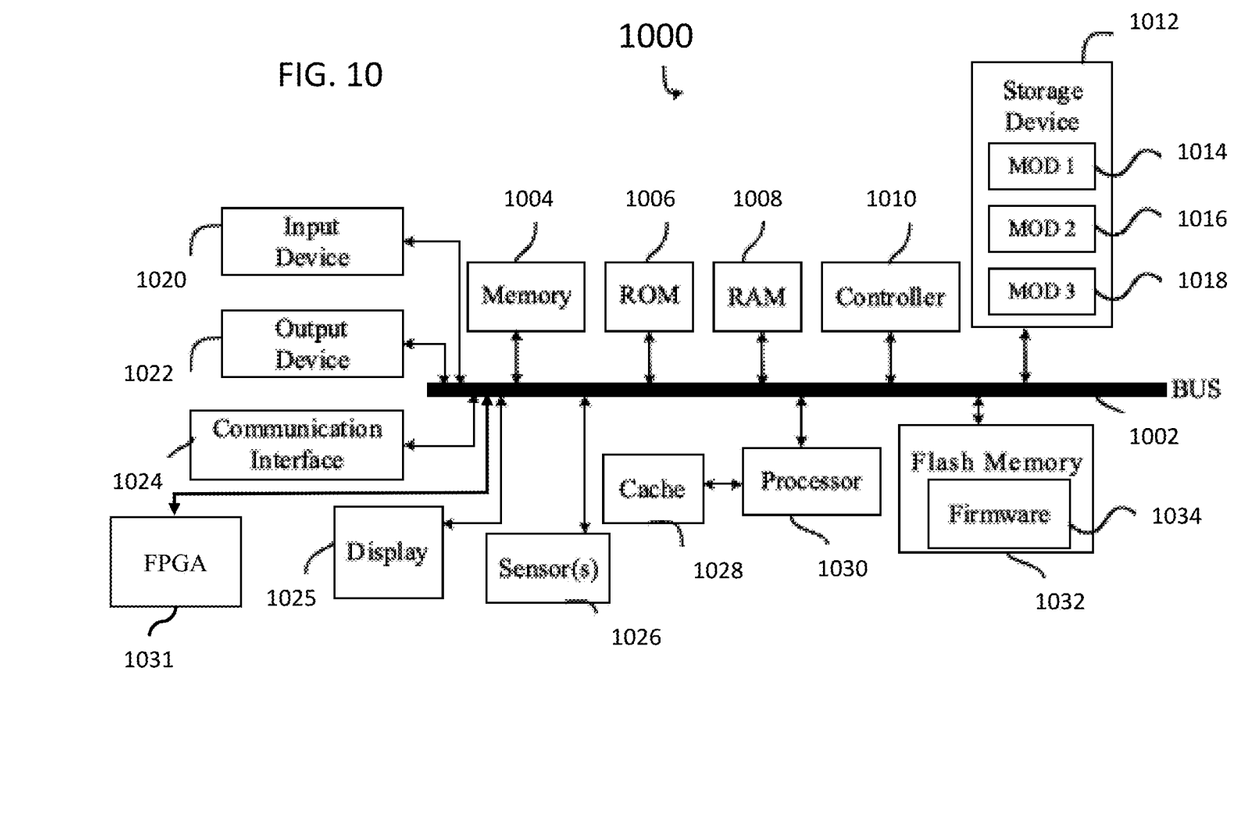
FIG. 10 illustrates an example computing system in which components of the computing system are in electrical communication with each other using a bus.

FIG. 10 illustrates an example computing system 1000, in which components of the computing system are in electrical communication with each other using a bus 1002. The system 1000 includes a processing unit (CPU or processor) 1030 and a system bus 1002 that couples various system components, including the system memory 1004 (e.g., read only memory (ROM) 1006 and random access memory (RAM) 1008), to the processor 1030. The system 1000 can include a cache of high-speed memory connected directly with, in close proximity to, or integrated as part of the processor 1030. The system 1000 can copy data from the memory 1004 and/or the storage device 1012 to the cache 1028 for quick access by the processor 1030. In this way, the cache can provide a performance boost for processor 1030 while waiting for data. These and other modules can control or be configured to control the processor 1030 to perform various actions. Other system memory 1004 may be available for use as well. The memory 1004 can include multiple different types of memory with different performance characteristics. The processor 1030 can include any general purpose processor and a hardware module or software module, such as module 1 1014, module 2 1016, and module 3 1018 embedded in storage device 1012. The hardware module or software module is configured to control the processor 1030, as well as a special-purpose processor where software instructions are incorporated into the actual processor design. The processor 1030 may essentially be a completely self-contained computing system, containing multiple cores or processors, a bus, memory controller, cache, etc. A multi-core processor may be symmetric or asymmetric.

In addition to processor 1030, other processors can be incorporated in system 1000. For example, as shown in FIG. 10, an FPGA 1031 or other processor can also be provided. As shown in FIG. 10, the FPGA 1031 can also be coupled to system bus 1002 to allow FPGA 1031 to communicate and interact with other components in system 1000. However, in some embodiments, the FPGA 1031 could be coupled to other components in system 1000.

To enable user interaction with the computing device 1000, an input device 1020 is provided as an input mechanism. The input device 1020 can comprise a microphone for speech, a touch-sensitive screen for gesture or graphical input, keyboard, mouse, motion input, and so forth. In some instances, multimodal systems can enable a user to provide multiple types of input to communicate with the system 1000. In this example, an output device 1022 is also provided. The communications interface 1024 can govern and manage the user input and system output. For example system output via a display 1025.

Storage device 1012 can be a non-volatile memory to store data that are accessible by a computer. The storage device 1012 can be magnetic cassettes, flash memory cards, solid state memory devices, digital versatile disks, cartridges, random access memories (RAMs) 1008, read only memory (ROM) 1006, and hybrids thereof.

The controller 1010 can be a specialized microcontroller or processor on the system 1000, such as a BMC (baseboard management controller). In some cases, the controller 1010 can be part of an Intelligent Platform Management Interface (IPMI). Moreover, in some cases, the controller 1010 can be embedded on a motherboard or main circuit board of the system 1000. The controller 1010 can manage the interface between system management software and platform hardware. The controller 1010 can also communicate with various system devices and components (internal and/or external), such as controllers or peripheral components, as further described below.

The controller 1010 can generate specific responses to notifications, alerts, and/or events, and communicate with remote devices or components (e.g., electronic mail message, network message, etc.) to generate an instruction or command for automatic hardware recovery procedures, etc. An administrator can also remotely communicate with the controller 1010 to initiate or conduct specific hardware recovery procedures or operations, as further described below.

The controller 1010 can also include a system event log controller and/or storage for managing and maintaining events, alerts, and notifications received by the controller 1010. For example, the controller 1010 or a system event log controller, can receive alerts or notifications from one or more devices and components, and maintain the alerts or notifications in a system event log storage component.

Flash memory 1032 can be an electronic non-volatile computer storage medium or chip that can be used by the system 1000 for storage and/or data transfer. The flash memory 1032 can be electrically erased and/or reprogrammed. Flash memory 1032 can include EPROM (erasable programmable read-only memory), EEPROM (electrically erasable programmable read-only memory), ROM, NVRAM, or CMOS (complementary metal-oxide semiconductor), for example. The flash memory 1032 can store the firmware 1034 executed by the system 1000 when the system 1000 is first powered on, along with a set of configurations specified for the firmware 1034. The flash memory 1032 can also store configurations used by the firmware 1034.

The firmware 1034 can include a Basic Input/Output System or equivalents, such as an EFI (Extensible Firmware Interface) or UEFI (Unified Extensible Firmware Interface). The firmware 1034 can be loaded and executed as a sequence program each time the system 1000 is started. The firmware 1034 can recognize, initialize, and test hardware present in the system 1000 based on the set of configurations. The firmware 1034 can perform a self-test, such as a POST (Power-on-Self-Test), on the system 1000. This self-test can test the functionality of various hardware components such as hard disk drives, optical reading devices, cooling devices, memory modules, expansion cards, and the like. The firmware 1034 can address and allocate an area in the memory 1004, ROM 1006, RAM 1008, and/or storage device 1012, to store an operating system (OS). The firmware 1034 can load a boot loader and/or OS, and give control of the system 1000 to the OS.

The firmware 1034 of the system 1000 can include a firmware configuration that defines how the firmware 1034 controls various hardware components in the system 1000. The firmware configuration can determine the order in which the various hardware components in the system 1000 are started. The firmware 1034 can provide an interface, such as an UEFI, that allows a variety of different parameters to be set, which can be different from parameters in a firmware default configuration. For example, a user (e.g., an administrator) can use the firmware 1034 to specify clock and bus speeds; define what peripherals are attached to the system 1000; set monitoring of health (e.g., fan speeds and CPU temperature limits); and/or provide a variety of other parameters that affect overall performance and power usage of the system 1000. While firmware 1034 is illustrated as being stored in the flash memory 1032, one of ordinary skill in the art will readily recognize that the firmware 1034 can be stored in other memory components, such as memory 1004 or ROM 1006.

System 1000 can include one or more sensors 1026. The one or more sensors 1026 can include, for example, one or more temperature sensors, thermal sensors, oxygen sensors, chemical sensors, noise sensors, heat sensors, current sensors, voltage detectors, air flow sensors, flow sensors, infrared thermometers, heat flux sensors, thermometers, pyrometers, etc. The one or more sensors 1026 can communicate with the processor, cache 1028, flash memory 1032, communications interface 1024, display 1025, memory 1004, ROM 1006, RAM 1008, controller 1010, and storage device 1012, via the bus 1002, for example. The one or more sensors 1026 can also communicate with other components in the system via one or more different means, such as inter-integrated circuit (I2C), general purpose output (GPO), and the like. Different types of sensors (e.g., sensors 1026) on the system 1000 can also report to the controller 1010 on parameters, such as cooling fan speeds, power status, operating system (OS) status, hardware status, and so forth.

Figure 11:
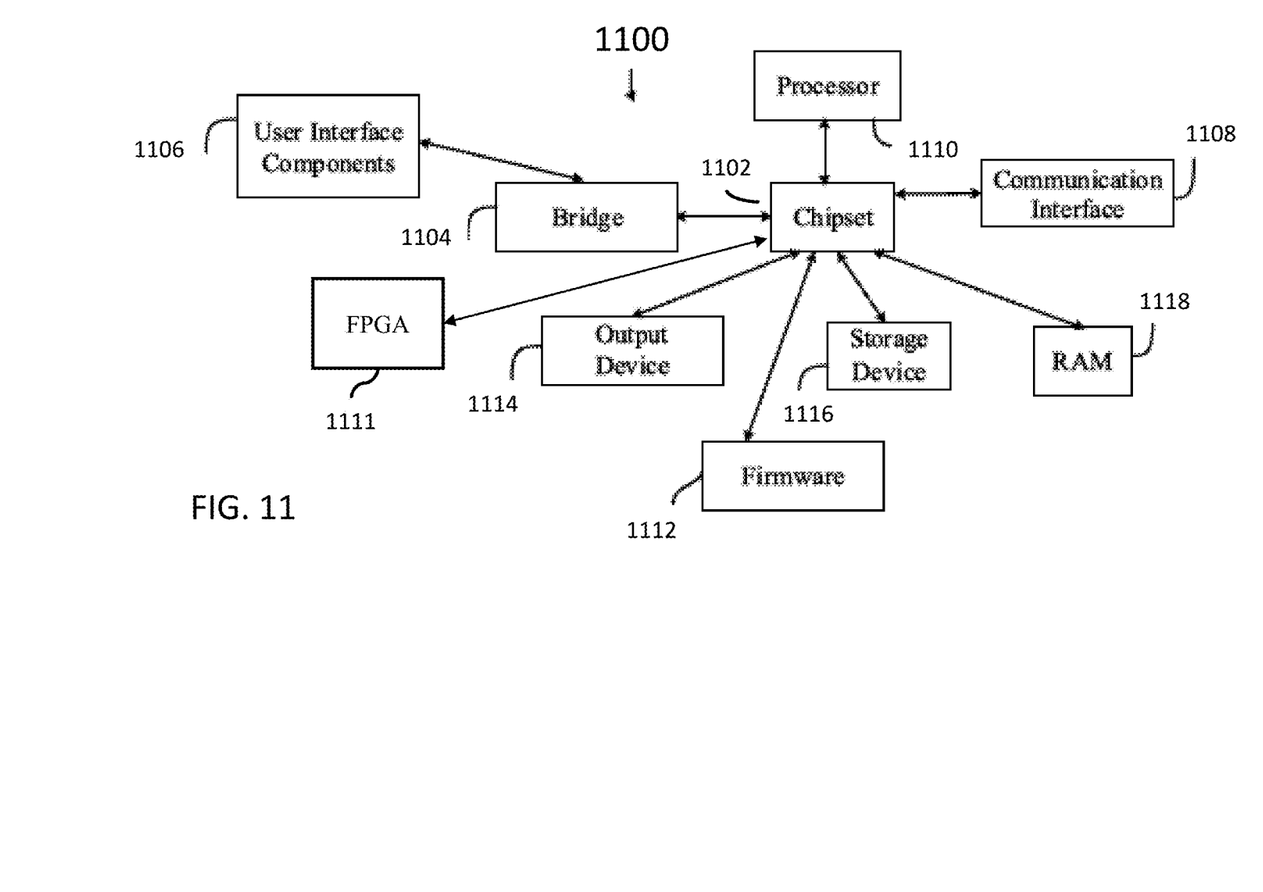
FIG. 11 illustrates an example computing system having a chipset architecture that can be used in executing the systems and methods of the various embodiments.

FIG. 11 illustrates an example computer system 1100 having a chipset architecture that can be used in executing the described method(s) or operations, and generating and displaying a graphical user interface (GUI). Computer system 1100 can include computer hardware, software, and firmware that can be used to implement the disclosed technology. System 1100 can include a processor 1110, representative of a variety of physically and/or logically distinct resources capable of executing software, firmware, and hardware configured to perform identified computations. Processor 1110 can communicate with a chipset 1112 that can control input to and output from processor 1110. In this example, chipset 1102 outputs information to output device 1114, such as a display, and can read and write information to storage device 1116. System 1100 can also include additional processors, such as FPGA 1111. FPGA 1111 can also communicate with chipset 1112 to control input to and output from FPGA 1111. However, in other embodiments, FPGA can be connected to other components in system, 1100.

The storage device 1116 can include magnetic media and solid state media, for example. Chipset 1102 can also read data from and write data to RAM 1118. A bridge 1104 for interfacing with a variety of user interface components 1106, can be provided for interfacing with chipset 1102. User interface components 1106 can include a keyboard, a microphone, touch detection and processing circuitry, and a pointing device, such as a mouse.

Chipset 1102 can also interface with one or more communication interfaces 1108 that can have different physical interfaces. Such communication interfaces can include interfaces for wired and wireless local area networks, for broadband wireless networks, and for personal area networks. Further, the machine can receive inputs from a user via user interface components 1106, and execute appropriate functions, such as browsing functions by interpreting these inputs using processor 1110.

Moreover, chipset 1102 can also communicate with firmware 1112, which can be executed by the computer system 1100 when powering on. The firmware 1112 can recognize, initialize, and test hardware present in the computer system 1100 based on a set of firmware configurations. The firmware 1112 can perform a self-test, such as a POST, on the system 1100. The self-test can test the functionality of the various hardware components 1102-1118. The firmware 1112 can address and allocate an area in the RAM 1118 to store an OS. The firmware 1112 can load a boot loader and/or OS, and give control of the system 1100 to the OS. In some cases, the firmware 1112 can communicate with the hardware components 1102-1110 and 1114-1118. Here, the firmware 1112 can communicate with the hardware components 1102-1110 and 1114-1118 through the chipset 1102, and/or through one or more other components. In some cases, the firmware 1112 can communicate directly with the hardware components 1102-1110 and 1114-1118.

It can be appreciated that example systems 1000 and 1100 can have more than one processor, or be part of a group or cluster of computing devices networked together to provide greater processing capability.

For clarity of explanation, in some instances, the present disclosure may be presented as including individual functional blocks, including functional blocks, devices, and/or device components, steps or routines in a method embodied in software, or combinations of hardware and software.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or special purpose processing device to perform a certain function or group of functions. Portions of computer resources that are used can be accessible over a network. The computer executable instructions may be, for example, binaries and intermediate format instructions, such as assembly language, firmware, or source code.

Devices implementing methods according to these disclosures can include hardware, firmware and/or software, and can take any of a variety of form factors. Typical examples of such form factors include laptops, smart phones, small form factor personal computers, personal digital assistants, rack-mount devices, standalone devices, and so on. Functionality described herein also can be embodied in peripherals or add-in cards. Such functionality can also be implemented on a circuit board among different chips, or different processes executed in a single device, by way of further example.

The various examples can be further implemented in a wide variety of operating environments, which in some cases can include one or more server computers, user computers, or computing devices which can be used to operate any of a number of applications. User or client devices can include any of a number of general purpose personal computers, such as desktop or laptop computers running a standard operating system, as well as cellular, wireless, and handheld devices running mobile software, and capable of supporting a number of networking and messaging protocols. Such a system can also include a number of workstations running any of a variety of commercially-available operating systems, and other known applications for purposes such as development and database management. These devices can also include other electronic devices, such as dummy terminals, thin-clients, gaming systems, and other devices capable of communicating via a network.

To the extent examples, or portions thereof, are implemented in hardware, the present disclosure can be implemented with one, or a combination of the following technologies: a discrete logic circuit(s) having logic gates for implementing logic functions upon data signals; an application specific integrated circuit (ASIC) having appropriate combinational logic gates; programmable hardware such as a programmable gate array(s) (PGA); a field programmable gate array (FPGA); etc.

Most examples utilize at least one network that would be familiar to those skilled in the art for supporting communications using a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network, and any combination thereof.

Devices implementing methods, according to these technologies, can include hardware, firmware and/or software, and can take a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips, or different processes executing in a single device, by way of further example.

In examples that utilize a Web server, the Web server can run a variety of server or mid-tier applications, including HTTP servers, FTP servers, CGI servers, data servers, Java servers, and business application servers. In response to requests from user devices, the Web server(s) can also be capable of executing programs or scripts. For example, the Web server can execute one or more Web applications, which can be implemented as one or more scripts or programs written in any programming language, such as Java®, C, C# or C++ or any scripting language, such as Perl, Python or TCL, as well as combinations thereof. The Web server(s) can also encompass database servers, including those commercially available on the open market.

The server system can include a variety of data stores and other memory and storage media, as discussed above. These can reside in a variety of locations, such as on a storage medium local to (and/or resident in) one or more of the computers, or remote from the computers across the network. In a particular set of examples, the information can reside in a storage-area network (SAN) familiar to those skilled in the art. Similarly, any necessary files for performing the functions attributed to the computers, servers, or other network devices can be stored locally and/or remotely, as appropriate. Where a system includes computerized devices, each such device can include hardware elements that can be electrically coupled via a bus, with the elements including for example, at least one central processing unit (CPU), at least one input device (e.g., a mouse, keyboard, controller, touch-sensitive display element or keypad), and at least one output device (e.g., a display device, printer or speaker). Such a system can also include one or more storage devices, such as disk drives, optical storage devices, and solid-state storage devices such as random access memory (RAM) or read-only memory (ROM), as well as removable media devices, memory cards, flash cards, etc.

Storage media and computer readable media for containing code, or portions of code, can include any appropriate media known or used in the art, including storage media and computing media. The storage media and computing media can include, but are not limited to, removable and non-removable media for storage and/or transmission of data or information. The removable and non-removable media comprise RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices. The removable and non-removable media can be used to store the desired information that can be accessed by a system device. The data or information can include computer readable instructions, data structures, program modules, or other data. Based on the technology and teachings provided herein, a person of ordinary skill in the art will appreciate other ways and/or methods to implement the various aspects of the present disclosure.

The specification and drawings are, accordingly, to be regarded in an illustrative rather than a restrictive sense. It will, however, be evident that various modifications and changes can be made thereunto without departing from the broader spirit and scope of the patent application, as set forth in the claims.

What is claimed is:

1. A method, comprising:
    obtaining a trained model for a deep learning process;
    converting the trained model to design abstraction (DA) code;
    programming a field programmable gate array (FPGA) device in a system based on the DA code;

wherein the DA code comprises code for programming a plurality of logic block circuits in the FPGA device, each of the plurality of logic block circuits representing one of a plurality of modules for executing a processing step between different layers of the deep learning process, wherein prior to the programming, determining that the FPGA device is insufficient for the plurality of logic block circuits required by the DA code and, consequently, implementing an alternate programming mode for the FPGA device during the programming, the alternate programming mode including identifying DA code corresponding to one or more of the plurality of logic blocks circuits representing an operation performed by another component in the system to yield duplicate logic block circuits;

deleting the duplicate logic block circuits from the DA code; and updating the DA code to configure the FPGA device to perform the duplicates of the operation using the other component.

2. The method of claim 1, wherein the DA code comprises register-transfer level code.

3. The method of claim 1, wherein the converting comprises the specifying of a flow of data through the plurality of logic block circuits, and wherein the DA code specifies an interconnection of the plurality of logic block circuits in the FPGA device to provide the flow of data.

4. The method of claim 3, wherein the converting comprises:

identifying a plurality of processing steps in the trained model;

associating each of the plurality of processing steps associated with one of the plurality of modules; and for each of the plurality of processing steps with one of the plurality of modules, encoding a one of the plurality of logic block circuits corresponding to the one of the plurality of modules.

5. A system, comprising:

a processor;

a field programmable gate array (FPGA) communicatively coupled to the processor; and a memory, having stored therein instructions for causing the processor to perform steps comprising:

obtaining a trained model for a deep learning process;

converting the trained model to design abstraction (DA) code; and programming the FPGA based on the DA code, wherein the DA code comprises code for programming a plurality of logic block circuits in the FPGA device, each of the plurality of logic block circuits representing one of a plurality of modules for executing a processing step between different layers of the deep learning process;

wherein prior to the programming, determining that the FPGA device is insufficient for the plurality of logic block circuits required by the DA code and, consequently, implementing an alternate programming mode for the FPGA device during the programming, the implementing including identifying DA code corresponding to one or more of the plurality of logic blocks circuits performing an operation performed by another component in the system to yield duplicate logic block circuits;

deleting the duplicate logic block circuits from the DA code; and updating the DA code to configure the FPGA device to perform the duplicates of the operation using the other component.

6. The system of claim 5, wherein the DA code comprises register-transfer level code.

7. The system of claim 5, wherein the converting comprises the specifying of a flow of data through the plurality of logic block circuits, and wherein the DA code specifies an interconnection of the plurality of logic block circuits in the FPGA device to provide the flow of data.

8. The system of claim 7, wherein the converting comprises:

identifying a plurality of processing steps in the trained model;

associating each of the plurality of processing steps with one of the plurality of modules; and for each of the plurality of processing steps associated with one of the plurality of modules, encoding a one of the plurality of logic block circuits corresponding to the one of the plurality of modules.

9. A non-transitory computer-readable medium, having stored thereon a computer program executable by a computing device, the computer program comprising a plurality of code sections for causing the computing device to perform steps comprising:

obtaining a trained model for a deep learning process;

converting the trained model to a design abstraction (DA) code;

programming a field programmable gate array (FPGA) device in a system based on the DA code, wherein the DA code comprises code for programming a plurality of logic block circuits in the FPGA device, each of the plurality of logic block circuits representing one of a plurality of modules for executing a processing step between different layers of the deep learning process;

wherein prior to the programming, determining that the FPGA device is insufficient for the plurality of logic block circuits required by the DA code and, consequently, implementing an alternate programming mode for the FPGA device during the programming, the implementing including identifying DA code corresponding to one or more of the plurality of logic blocks circuits performing an operation performed by another component in the system to yield duplicate logic block circuits;

deleting the duplicate logic block circuits from the DA code; and updating the DA code to configure the FPGA device to perform the duplicates of the operation using the other component.

10. The computer-readable medium of claim 9, wherein the design abstraction code comprises register-transfer level code.

11. The computer-readable medium of claim 9, wherein the converting comprises the specifying of a flow of data through the plurality of logic block circuits, and wherein the DA code specifies an interconnection of the plurality of logic block circuits in the FPGA device to provide the flow of data.

12. The computer-readable medium of claim 11, wherein the converting comprises:

identifying a plurality of processing steps in the trained model;

associating each of the plurality of processing steps with one of the plurality of modules; and for each of the plurality of processing steps with one of the plurality of modules, encoding a one of the plurality of logic block circuits corresponding to the one of the plurality of modules.

* * * * *